US005633795A

United States Patent [19]

Popovich

[11] Patent Number: 5,633,795

[45] Date of Patent: May 27, 1997

[54] ADAPTIVE TONAL CONTROL SYSTEM WITH CONSTRAINED OUTPUT AND ADAPTATION

[75] Inventor: Steven R. Popovich, Stoughton, Wis.

[73] Assignee: Digisonix, Inc., Middleton, Wis.

[21] Appl. No.: 369,925

[22] Filed: Jan. 6, 1995

[51] Int. Cl.[6] .......... G05B 13/02; H03B 29/00

[52] U.S. Cl. .......... 364/148; 364/149; 364/153; 381/71

[58] Field of Search .......... 364/148–152, 364/153, 160–166; 381/71, 47, 94; 318/561

[56] References Cited

U.S. PATENT DOCUMENTS

| | | | |
|---|---|---|---|
| 4,677,676 | 6/1987 | Eriksson | 381/71 |
| 4,950,966 | 8/1990 | Moulds, III . | |
| 5,049,795 | 9/1991 | Moulds, III . | |
| 5,140,640 | 8/1992 | Graupe et al. | 381/71 |
| 5,164,647 | 11/1992 | Moulds, III . | |
| 5,170,433 | 12/1992 | Elliott et al. . | |
| 5,233,540 | 8/1993 | Andersson et al. . | |
| 5,278,913 | 1/1994 | Delfosse et al. . | |
| 5,365,594 | 11/1994 | Ross et al. | 381/71 |
| 5,404,409 | 4/1995 | Nagami et al. | 381/71 |
| 5,440,641 | 8/1995 | Kuusama | 381/71 |

OTHER PUBLICATIONS

"High-Speed Synchronized Filtered-X Algorithm Using Single Frequency Adaptive Notch Filter" by K. Ito and H. Hamada; Yokohama, Japan, Aug. 29–31, 1994, pp. 1237–1240.

"An Adaptive Modal-Based Active Control System" by Dennis R. Morgan, J. Acoust. Soc. Am 89(1), Jan. 1991, pp. 248–256.

*Primary Examiner*—Paul P. Gordon
*Assistant Examiner*—Thomas E. Brown
*Attorney, Agent, or Firm*—Andrus, Sceales, Starke & Sawall

[57] ABSTRACT

An adaptive control system and method for actively canceling tones in an active acoustic attenuation system has an adaptive parameter bank. Adaptation of the adaptive parameter bank can be constrained with respect to the null space of a C model of an auxiliary path (e.g. speaker-error). Alternatively, output from the adaptive parameter bank can be constrained with respect to the effective null space of the C model. The preferred system uses singular value decomposition, normalization, and demodulation to implement the methods of constraining output and adaptation. The invention can eliminate stability and tracking problems associated with over-parameterization.

45 Claims, 5 Drawing Sheets

ADAPTIVE TONAL CONTROL SYSTEM WITH CONSTRAINED OUTPUT AND ADAPTATION

FIELD OF THE INVENTION

The invention relates generally to adaptive control systems and methods. The invention is particularly useful for actively canceling tones in an active acoustic attenuation system.

BACKGROUND OF THE INVENTION

In many active control applications, cancellation is required only at discrete frequencies where tonal disturbances exist. While adaptive filter-based systems using the filtered-X and filtered-U LMS update methods are effective in canceling broadband disturbances, adaptive filters can be computationally burdensome when canceling tones, especially if the number of cancellation actuators and error sensors is large.

Moreover, in tonal applications, broadband adaptive filters can sometimes be over-parameterized. Over-parameterization can lead to lack of persistent excitation within the filter. Another problem with over-parameterization is that the potential exists for output from separate cancellation actuators to increase yet cancel one another, thus avoiding detection by error sensors. This can lead to unnecessarily high power consumption, and instability. These problems can be remedied via leakage methods, but most leakage methods can compromise performance.

Another characteristic of adaptive filters is that, with respect to adaptation, there exists an interdependence among all tap weight values in the filter. This interdependence can reduce convergence rate.

As an alternative to the filtered-X and filtered-U LMS updates, Fast Fourier Transforms can be used to transform signals from error sensors into the frequency domain as a set of complex numbers. The real and imaginary part can then be separately filtered through the complex transpose (i.e. Hermitian transpose) of a transfer function representing the speaker-error path. This procedure accounts for phase shifts and delays through the speaker-error path and can be used to improve stability. But, this procedure can be quite burdensome computationally, and also increases time to track changes in the system.

It is therefore desirable to provide a method of attenuating selected tones in a system input that avoids over-parameterization, accounts for phase shifts or delays through the speaker-error path, reduces the required amount of processing and improves the convergence rate of the system, while at the same time maintains long term stability.

SUMMARY OF THE INVENTION

The invention provides an adaptive control system and method that is capable of effectively attenuating selected tones in a system input without the problems described above.

In one aspect, the invention is a tonal control system and method in which the output from an adaptive controller is constrained with respect to the null space (or an effective null space) of an auxiliary path (e.g. a speaker-error path in a sound cancellation system). The system has a plurality of actuators each receiving a correction signal $y_n$ and outputting a secondary input which combines with a system input to yield a system output. A plurality of error sensors sense the system output, and each error sensor generates an error signal. An adaptive controller outputs the correction signals $y_n$ to the plurality of actuators.

The adaptive controller has an adaptive parameter bank that outputs a plurality of output signals in accordance with adaptive parameters. The adaptive parameters in the adaptive parameter bank are normally updated using the error signals or some signal derived therefrom. The adaptive controller also has a model of the auxiliary path between the output of the adaptive controller and the error sensors which is referred to as a C model. The C model has an effective range and an effective null space, the effective null space being defined as the subspace spanned by $y_n$, such that $Cy_n=0$ or close to zero where C is a matrix representing the C model, and $y_n$ is a vector representing the correction signals. The adaptive controller also has an output weighting element that inputs the output signals from the adaptive parameter bank and weights the output signals to generate correction signals $y_n$ which are constrained to be within an efficiently controlling subspace of the C model.

A preferred method to weight the output signals so that the correction signals are within the efficiently controlling subspace of the C model is to use a singular value decomposition of a C model matrix such that:

$$C=USV^H$$

where S is a real-valued matrix in which the off diagonal elements are zero, U is a unitary matrix, and $V^H$ is the Hermitian transpose of a unitary matrix V. The output weighting element can then include a matrix representing $—VS^HU^H$, and it may be preferred in many applications to selectively normalize the diagonal elements in $S^H$. In another preferred embodiment, the output weighting element can include a matrix representing V. In this embodiment, it is preferred that the adaptive controller also have an error weighting element that includes a matrix representing $—S^HU^H$, where again it may be preferred to selectively normalize the diagonal elements of $S^H$.

In another aspect of the invention, the adaptation of the parameter bank is constrained with respect to the effective null space of the C model. In such a system, the adaptive controller has an adaptive parameter bank that outputs a plurality of output signals in accordance with adaptive parameters. The output signals are used to generate the correction signals $y_n$, and in embodiments without an output weighting element, the output signals can be used directly as the correction signals $y_n$. The adaptive controller has an error weighting element that inputs the error signals from the error sensors and weights the error signals to generate error input signals used to update the adaptive parameters in the adaptive parameter bank. The error weighting element generator error input signals such that adaptation is constrained to be within the efficiently controlling subspace of the C model. In one preferred system, the error weighting element can be represented by the matrix $—VS^HU^H$. In another embodiment described above, the output weighting element can be set to V, and the error weighting element set to $—S^HU^H$ where it may be preferred to selectively normalize $S^H$.

In another aspect, the invention provides a system and method of demodulation for determining the adaptive parameters in the adaptive parameter bank so that the system operates to minimize a set of error signals. In this aspect, the adaptive controller in the preferred system has an adaptive parameter bank that inputs a reference signal during sequential sample periods and outputs a plurality of modulated output signals in accordance with adaptive parameters for each of the sequential sample periods. An error weighting element receives error signals from error sensors and outputs a plurality of error input signals. The adaptive controller also has a parameter update generator that applies both an in-phase demodulation signal and an quadrature demodulation signal to the error input signals for each sample period when generating update signals, and outputs an in-phase update signal and a quadrature update signal that are used to update the adaptive parameters in the adaptive parameter bank. The in-phase demodulation signal preferably has the same frequency as the tone being controlled, and the quadrature demodulation signal is preferably shifted 90°. In such a system, the error or the output weighting elements can be $—C^H$ or $—C^{-1}$, but it is preferred to constrain output and/or adaptation as discussed above.

An object of the invention is to improve system stability and other problems associated with over parameterization. The invention can accomplish these objects by constraining adaptation of the adaptive parameter bank with respect to the effective null space of the C model of the speaker-error path. Alternatively, the invention can accomplish these objectives by constraining the output from the adaptive parameter bank with respect to the effective null space of the C model.

Another object of the invention is to account for the effects of propagation delay through the speaker error path. The invention accomplishes this object through demodulation which accounts for the effect of any change in actuator output to the received error signal.

Yet another object of the invention is to improve frequency tracking. The invention can accomplish this object by matching output from the adaptive parameter bank in consecutive sample periods, even when the output weighting matrix is replaced, to promote fast tracking.

DESCRIPTION OF THE PREFERRED EMBODIMENTS

Figure 1:
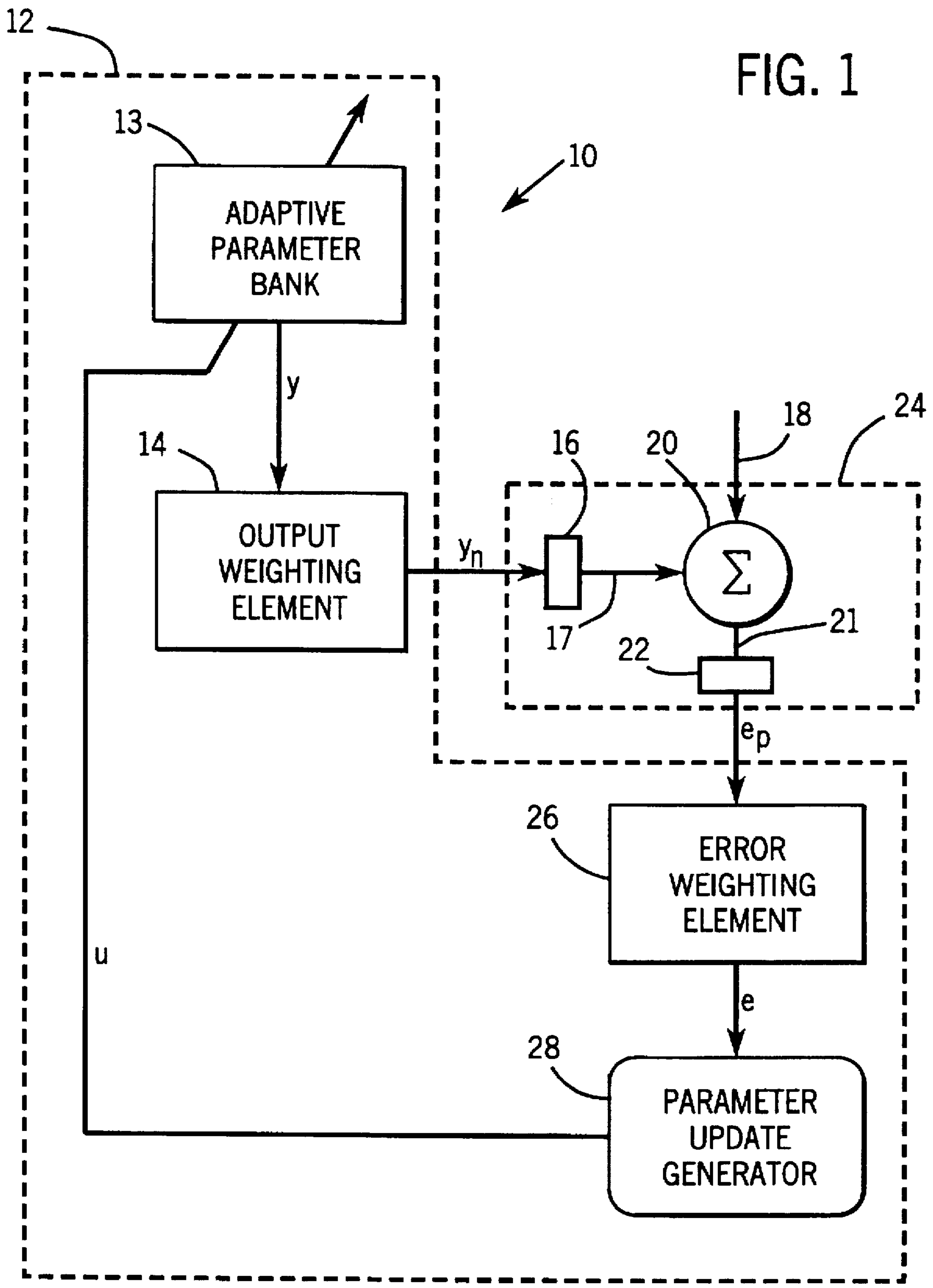
FIG. 1 is a schematic illustration of an active acoustic attenuation system that attenuates a tone at a discrete frequency in accordance with the invention.

FIG. 1 illustrates an active acoustic attenuation system designated generally as 10. The system 10 uses an adaptive controller 12 to attenuate a tone at a particular frequency in a disturbance 18. The adaptive controller 12 is preferably embodied within a programmable digital signal processor. The adaptive controller 12 has an adaptive parameter bank 13, a parameter update generator 28; and either an output weighting element 14, an error weighting element 26, or both 14 and 26. To attenuate several tones at distinct frequencies, several attenuation systems 10 such as shown in FIGS. 1–5 can be implemented separately and contemporaneously on the same digital signal processor. Separate tones are substantially orthogonal so an adaptive controller 12 implementing separate and contemporaneous tonal attenuation systems 10 can effectively attenuate several tones in a disturbance 18.

In the adaptive controller 12, the adaptive parameter bank 13 generates a plurality of m output signals y. The m output signals y can be applied to an output weighting element 14 to generate n correction signals $y_n$. It is preferred that the m output signals y be a vector of digital signals, and that the output weighting element 14 be an m×n output matrix.

Each of the n correction signals $y_n$ drives an actuator 16 that provides a secondary input or cancellation signal 17 that combines with a system input to yield a system output 21. That is, the secondary inputs 17 from the actuators 16 propagate into the system and attenuate the disturbance 18 to yield the system output 21 as represented schematically by summing junction 20. A plurality of p error sensors 22 senses the system output 21, and generates p error signals $e_p$. In FIG. 1, the path of the n correction signals $y_n$ through the n actuators 16, the path of the secondary inputs or cancellation signals between the actuators 16 and the error sensors 22, and the path through the p error sensors 22 is defined as a p×n auxiliary path (e.g. a p×n speaker-error path), and is illustrated by block 24.

The adaptive controller 12 receives an error signal $e_p$ from each of the p error sensors 22. The controller 12 can have an error weighting element 26 that processes the p error signals $e_p$ to yield m error input signals e. The error weighting element 26 is preferably an m×p matrix.

The parameter update generator 28 in the controller 12 receives the m error input signals e, and generates a set of parameter updates u. The parameter updates u are used to adapt one or more scaling vectors in the adaptive parameter bank 13. A scaling vector can be adapted by accumulating the updates u with the existing scaling vector. The scaling vector is then typically applied to a tonal reference signal to generate the m adaptive output signals y.

The output weighting element 14 and the error weighting element 26 can be chosen to constrain the output from the controller 12 (i.e., constrain the correction signals $y_n$ transmitted to the actuators 16), and/or to improve the convergence of the adaptation process. There are several methods for generating the output 14 and error weighting elements 26, but it is preferred that a model of the speaker-error path 24, referred to herein as a C model, be used to generate the output 14 and error weighting elements 26. The C model can be generated off-line, but it is preferred that the C model be adaptively generated on-line as described in U.S. Pat. No. 4,677,676 which is incorporated herein by reference for the purposes of adaptive on-line C modeling. In the preferred system 10, the C model is represented by a p×n matrix C.

The error sensors 22 preferably generate error signals $e_p$ every sample period k. It is desirable to adapt the controller 12 rapidly in real time with respect to sample period k. This can be approximated over time by demodulating the error input signals e by the in-phase and quadrature components of the particular frequency being attenuated. The demodulation is accomplished using in-phase and quadrature demodulation signals in the parameter update generator 28. The in-phase and quadrature components are formed for the particular frequency being attenuated. Therefore, the need for performing Fast Fourier Transforms on the error signals has been alleviated, as well as other off-line analysis such as averaging or integrating over one or more periods to account for propagation delay in the auxiliary C path.

Figure 2:
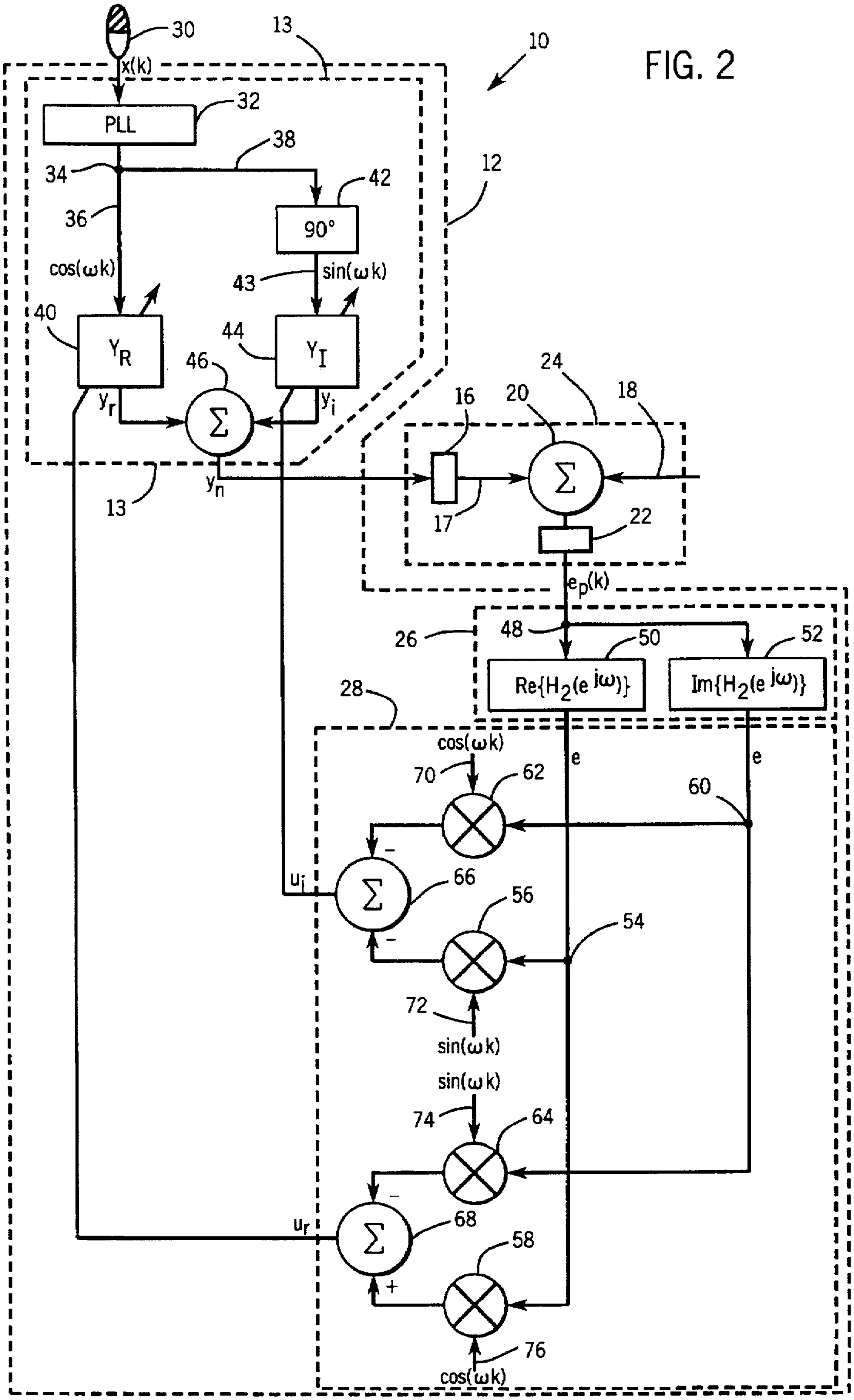
FIG. 2 is a schematic illustration of an active tonal attenuation system that has an error weighting element in accordance with the invention.

FIG. 2 illustrates a system 10 implementing the demodulation method described generally above. In FIG. 2, the system 10 implements a weighted error method of adaptation. The system 10 in FIG. 2 is similar to the general system 10 shown in FIG. 1 in many respects, expect the output weighting element 14 is omitted in FIG. 2 (i.e. set to identity). An advantage of omitting the output weighting element 14 is that there is a savings in processing requirements. Also, when tracking over large ranges of frequencies it may be useful to have multiple versions of the output weighting element 14 and the error weighting element 26 available on the digital signal processor, and omitting the output weighting element 14 reduces the burden of switching between multiple versions.

In FIG. 2, the adaptive parameter bank 13 in the controller 12 receives an input signal x(k) from an input sensor 30. The input signal is transmitted to a phase locked loop circuit 32 in the controller 12. The phase locked loop circuit 32 outputs a reference signal at a particular frequency which is the frequency of the tone being attenuated. In particular, the reference signal is preferably a discrete time sequence in the form of a cosine wave at a particular frequency. It is preferred that the reference signal have a normalized magnitude. Other methods of obtaining a reference signal can be used within the spirit of the invention, however, the phase locked loop circuit 32 is preferred because it allows frequency tracking.

The reference signal is separated into two signals at junction 34: An in-phase reference signal is transmitted through line 36, and a quadrature reference signal is transmitted through line 38. The in-phase reference signal is transmitted through line 36 to an in-phase scaling element 40. The in-phase scaling element 40 multiples the in-phase reference signal by an in-phase scaling vector $Y_R$ to generate m in-phase components $y_r$ of the adaptive output signals $y_n$. The in-phase scaling element 40 stores the values of the in-phase scaling vector $Y_R$, and updates the values. The values of $Y_R$ are updated by summing the product of an in-phase update signal $u_r$ multiplied by a step size μ.

Contemporaneously, quadrature components $y_i$ of the output signals $y_n$ are generated. The quadrature reference signal is transmitted through line 38 to a phase shifter 42 that shifts the quadrature reference signal 90° to in effect generate a sine wave corresponding to the cosine wave. Thus, in this context, the term quadrature reference signal corresponds to a reference signal that has been phase shifted 90° from the in-phase reference signal. The quadrature scaling element 44 multiplies the quadrature reference signal by a quadrature scaling vector $Y_I$ to generate m quadrature components $y_i$ of the adaptive output signals $y_n$. The scaling element 44 stores the values of the quadrature scaling vector $Y_I$, and updates the values by summing the values by the product of a quadrature update signal $u_i$ multiplied by the step size μ.

The m in-phase output signals $y_r$ and the m quadrature $y_i$ output signals are summed at summer 46 to generate m correction signals $y_n$, where in the case of FIG. 2 m=n. The n correction signals $y_n$ are transmitted to n actuators 16.

The array of error sensors 22 generate p error signals $e_p$. The p error signals $e_p$ are transmitted to error weighting element 26. The error weighting element 26 can be determined using the p×n C matrix to eliminate problems associated with over-parameterization and to also account for phase shifts and delay in the auxiliary C path. The matrix C can be decomposed at the frequencies of interest using singular value decomposition as represented below:

$$C=USV^H \tag{1}$$

where U is an p×p matrix, S is a p×n matrix, and $V^H$ is an n×n Hermitian transpose of an n×n matrix V. The matrices U and V are unitary matrices, and the off diagonal elements of S are zero while the diagonal elements are in general real and positive. In one embodiment, the error weighting element 26 preferably applies the n×p matrix $H_2$=—$VN^HU^H$, where V is an n×n matrix; $N^H$ is an n×p matrix that is the Hermitian transpose of normalizing matrix N which is formed by inverting some of the values on the diagonal of S (e.g., the values that are not zero or close to zero); and $U^H$ is the Hermitian transpose of an p×p matrix U.

The C matrix has an efficiently controlling subspace and an effective null space. The efficiently controlling subspace is the subspace spanned by the columns of V corresponding to relatively large singular values (e.g. all singular values larger than 0.02 times the largest singular value). The effective null space corresponds to the subspace spanned by the remaining columns in V (e.g. the smallest singular values). In other words, the effective null space is defined by:

$$\sqrt{\frac{\|Cy_n\|}{\|y_n\|}} < (.02)\ (\text{largest singular value}), \tag{2}$$

where C is a matrix representing the C path model and $y_n$ is a vector representing non-trivial correction signals.

One purpose of applying —$VN^HU^H$ is that adaptation will not occur in the effective null space of C. Since the columns of V corresponding to the effective null values of N are not included in the adaptation process, any components that previously existed or that accumulate as a result of noise in the system are likely to be left unchecked. Therefore, it is preferred in this embodiment to subtract or leak from the output signals $y_r$ and $y_i$ as needed (i.e. components of y in the effective null space of C).

The use of normalizing matrix N can improve the rate of convergence. In the case of n=p and $N=S^{-1}$, the n×p matrix $H_2$=—$VN^HU^H$ is equal to —$C^{-1}$. Alternatively, the error weighting element 26 can apply an n×p matrix $H_2$=—$C^H$ where $C^H$ is the Hermitian transpose of the p×n C matrix.

Error weighting element 26 preferably has a junction 48, an in-phase weighting element 50 and a quadrature weighting element 52. Each of the p error signals $e_p$ is transmitted to the junction 48, and the p error signals $e_p$ are then contemporaneously transmitted to the in-phase weighting element 50 and to the quadrature weighting element 52. The in-phase element 50 of the error weighting element 26 contains the real parts of the complex elements of the error weighting matrix $H_2$. The quadrature element 50 of the error weighting element 26 contains the coefficients of the imaginary parts of the complex elements of the error weighting matrix $H_2$. Both the in-phase 50 and the quadrature 52 elements of the error weighting element 26 contain real values. When referring herein to in-phase and quadrature weighting element, the term in-phase weighting element refers to the real parts of the complex elements in a weighting matrix, and the term quadrature weighting element refers to the imaginary parts of the complex elements in a weighting matrix. The p error signals $e_p$ are processed contemporaneously through the in-phase element 50 and the quadrature element 52 to each provide m error input signals e (i.e. n=m in the case of FIGS. 2 and 3). Both sets of m error input signals are real, and are transmitted to the update generator 28.

The update generator 28 includes junctions 54 and 60, multipliers 56, 58, 62 and 64, and summers 66 and 68. The set of m error input signals e from the in-phase element 50 of the error weighting element 26 is transmitted to junction 54, where the signals e are split. From junction 54, one set of m error input signals e is provided to multiplier 56, and another set of m error input signals e is provided to multiplier 58. Likewise, the set of m error input signals e from the quadrature element 52 of the error weighting element 26 is transmitted to junction 60, where the signals e are split. From junction 60, one set of m error input signals e is provided to multiplier 62, and another set of m error input signals e is provided to multiplier 64.

The m error input signals e provided to multiplier 62 are multiplied by the in-phase demodulation signal 70, which is preferably the same as the normalized in-phase reference signal 36. The m error input signals e provided to multiplier 56 are multiplied by the quadrature demodulation signal 72, which is preferably the same as the normalized phase-shifted quadrature reference signal in line 43. This demodulation should occur during each sample period of adaptation. The output from multipliers 56 and 62 is summed in summer 66 to generate the negative of m updates $u_i$ for the quadrature scaling vector $Y_I$ in the quadrature scaling element 44 that generates the quadrature reference signals $y_i$.

The m error input signals e provided to multiplier 58 are multiplied by the normalized in-phase demodulation signal 76. The m error input signals e provided to multiplier 64 are multiplied by the normalized quadrature demodulation signal 74. This demodulation should occur during each sample period of adaptation. The output from multipliers 58 and 64 is subtractively summed in summer 68 to generate m updates $u_r$ for the in-phase scaling vector $Y_R$ in the in-phase scaling element 40 that generates the m in-phase reference signals $y_r$.

The scaling vectors $Y_R$ and $Y_I$ are the adaptive parameters in the adaptive parameter bank 13. A reasonable bound on adaptation step size $\mu_{max}$ is 0.25 divided by the number of sample periods corresponding to the average propagation delay through the auxiliary path 24 between the actuators 16 and the error sensors 22. In cases where the error path 24 is highly resonant, the step size $\mu$ should be smaller.

The weighted error method of adaptation as shown in FIG. 2 approximates a real-time system and accounts for the propagation delay in the speaker-error path 24 (i.e. auxiliary C path) because the updates are being accumulated over time. In the system 10 of FIG. 2, the in-phase $y_r$ and quadrature $y_i$ output signals are orthogonal and the update signals $u_r$ and $u_i$ from summers 66 and 68 provide adaptation essentially along these orthogonal directions.

Figure 3:
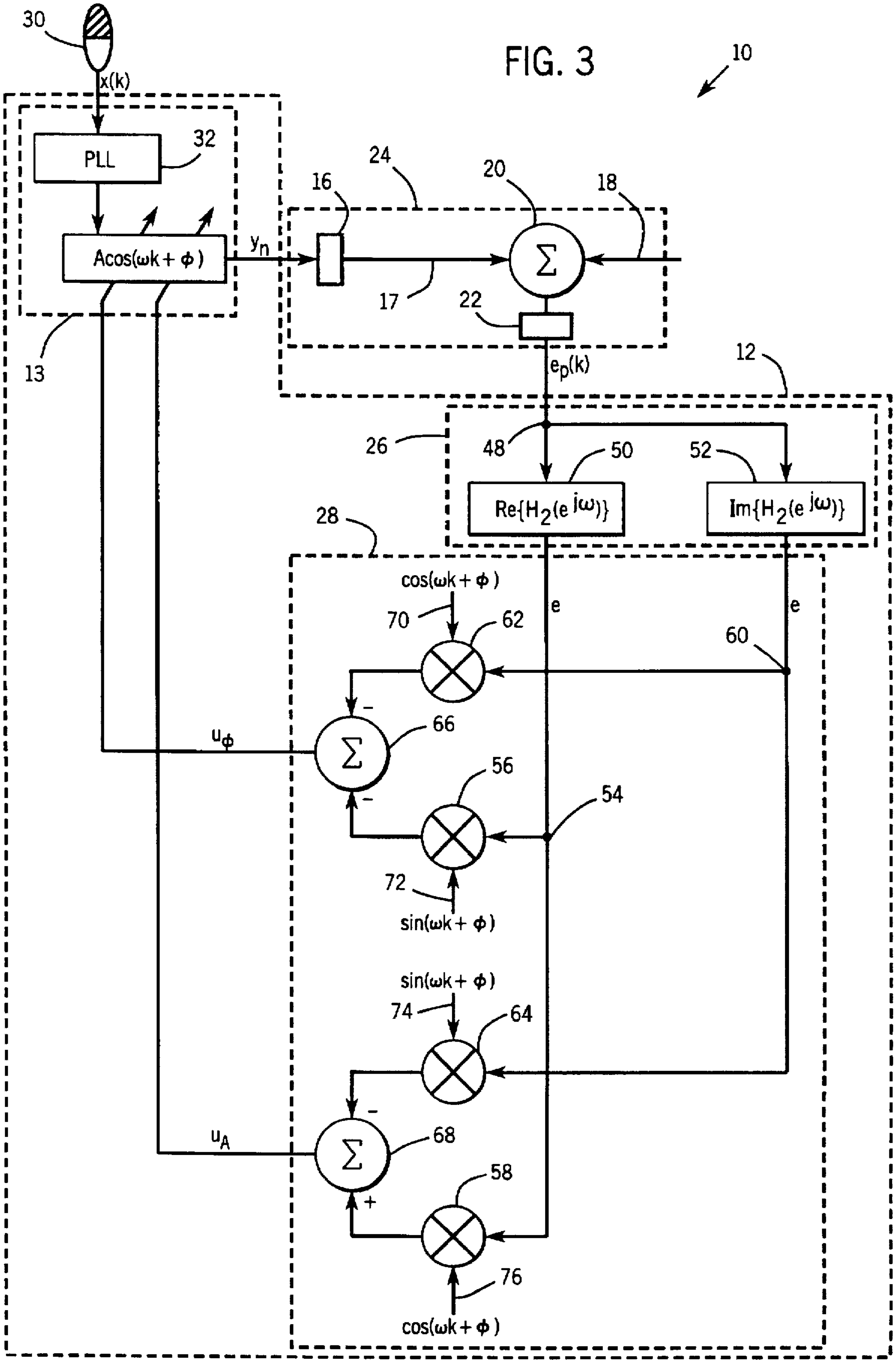
FIG. 3 is a schematic illustration similar to FIG. 2 showing another embodiment of an active tonal attenuation system having an error weighting element, in accordance with the invention.

It is not necessary, however, that the correction signals $y_n$ be generated from the combination of in-phase $y_r$ and quadrature $y_i$ output signals as shown in FIG. 2. Referring to FIG. 3, the plurality of n (i.e. n=m) correction signals $y_n$ can be generated by a parameter bank 13 in the form $A\cos(\omega k+\phi)$ where $\omega$ is the frequency estimate from the phase locked loop circuit 32, A is an adaptive amplitude, and $\phi$ is an adaptive phase shift. In this case, the in-phase reference signals 70 and 72 are of the form $\cos(\omega k+\phi)$, and the quadrature reference signals 72 and 74 are of the form $\sin(\omega k+\phi)$. The updates $u_A$ from summer 68 update the amplitude A, and the updates $u_\phi$ from summer 66 update the phase shift $\phi$. The amplitude A and the phase shift $\phi$ are not in general orthogonal, such as the in-phase $y_r$ and quadrature $y_i$ input signals shown in FIG. 2, and a system 10 as shown in FIG. 3 is less likely to adapt along the shortest path of the error surface as the system 10 shown in FIG. 2.

Figure 4:
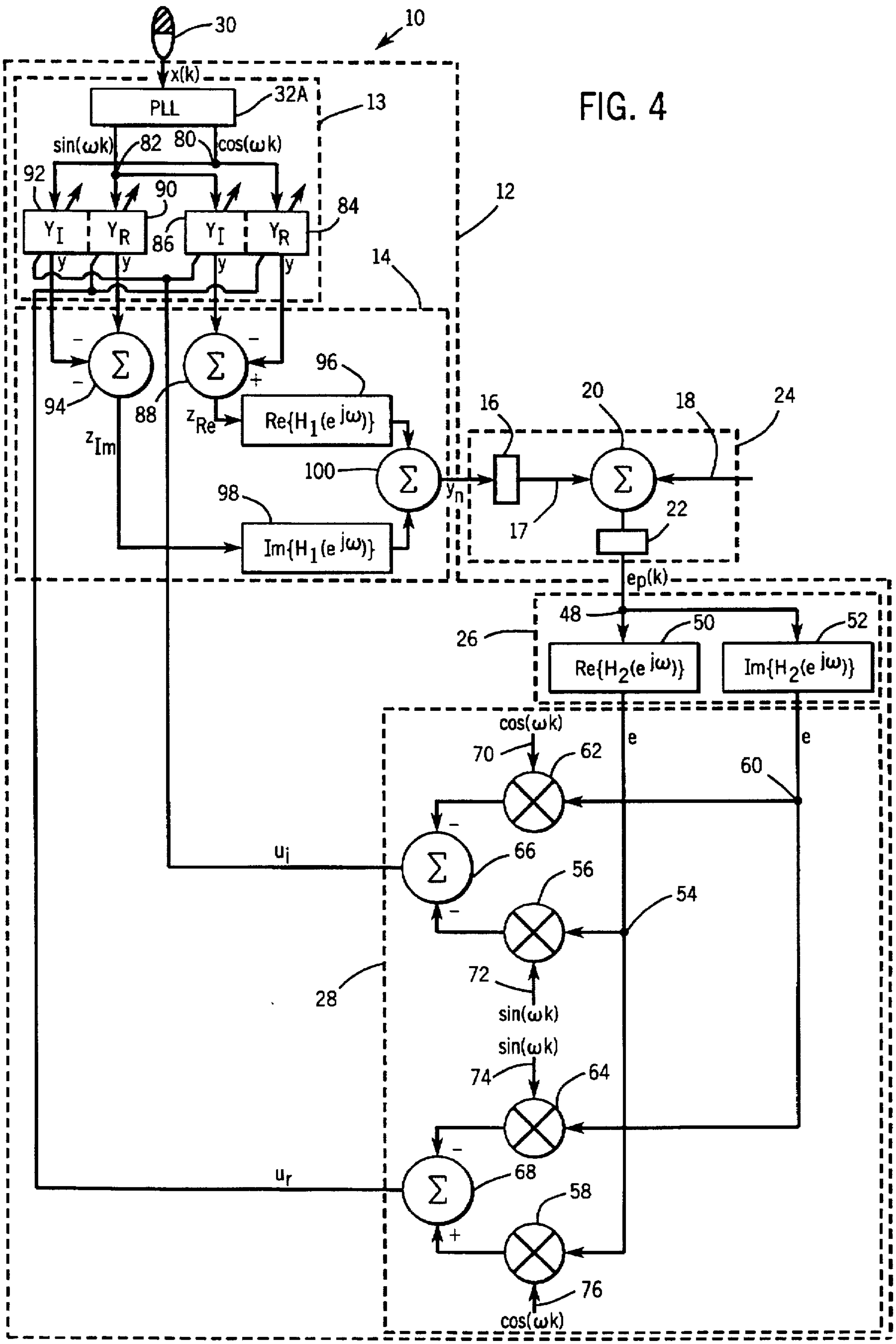
FIG. 4 is a schematic illustration of an active tonal attenuation system that has both an error weighting element and an output weighting element in accordance with the invention.

The system 10 shown in FIG. 4 implements a constrained output control method. The system 10 in FIG. 4 uses an update generator 28 and an error weighting element 26 that can be similar to the system 10 in FIG. 2, but the adaptive parameter bank 13 and the output weighting element 14 are preferably different than in FIG. 2. In FIG. 4, an input signal x(k) from an input sensor 30 is transmitted to the adaptive parameter bank 13 in the controller 12. The input signal x(k) is received by a phase locked loop circuit 32A, which is now illustrated in FIG. 4 to include a phase shifter such as phase shifter 42 shown in FIG. 2. The phase locked loop circuit 32A transmits an in-phase reference signal $\cos(\omega k)$ to junction 80. Thereafter, the in-phase reference signal is transmitted to scaling element 84, and to scaling element 92. The phase locked loop circuit 32A also transmits a quadrature reference signal $\sin(\omega k)$ to junction 82. Thereafter, the quadrature reference signal is transmitted to scaling element 90, and to scaling element 86. Scaling elements 84 and 90 use the same or a copy of the same adaptive in-phase scaling vector $Y_R$. Likewise, scaling elements 86 and 92 use the same or a copy of the same adaptive quadrature scaling vector $Y_I$. The adaptive parameters in the adaptive parameter bank 13, thus includes an adaptive quadrature scaling vector $Y_I$, an adaptive in-phase scaling vector $Y_R$ and copies of the same.

The output from the scaling elements 84, 86, 90 and 92 is in general a set of 4×m output signals y. The output signals y are transmitted to the output weighting element 14 for processing in which the output signals are preferably scaled and combined to generate a set of n scaled and phase shifted correction signals $y_n$. The output signal from scaling element 84 is subtractively summed with the output signal from the scaling element 86 in summer 88. The negative of the output signal from scaling element 90 is summed with the negative of the output signal from the scaling element 92 in summer 94. The output from the summer 88 is in general a set of m in-phase processing signals $z_{Rc}$ (i.e. real component). The output from the summer 94 is in general a set of m quadrature processing signals $z_{Rc}$ (i.e. imaginary component).

The m in-phase processing signals $z_{Rc}$ from summer 88 are transmitted to an in-phase element 96 of the output weighting element 14, $\mathrm{Re}\{H_1(e^{j\omega})\}$. The m quadrature processing signals $z_{Rc}$ from summer 94 are transmitted to a quadrature element 98 of the output weighting element 14, $\mathrm{Im}\{H_1(e^{j\omega})\}$. The in-phase element 96 of the output weighting element 14 contains the coefficients of the real parts of the complex elements of the output weighting matrix, $H_1(e^{j\omega})$. The quadrature element 98 of the output weighting element 14 contains the coefficients of the imaginary parts of the complex elements of the output weighting matrix, $H_1(e^{j\omega})$. The in-phase 96 and the quadrature 98 elements of the output weighting element contain real values. Both the in-phase 96 and the quadrature 98 elements of the output weighting element 14 are preferably n×m matrices. The output from the in-phase 96 and the quadrature 98 elements of the output weighting element are summed in summer 100 to form n correction signals $y_n$. The n correction signals $y_n$ are transmitted to an array of n actuators 16 as discussed above.

The structure of the adaptive parameter bank 13 and the output weighting element 14 represented as $H_1(e^{j\omega})$ can be understood by expanding the term $H_1y$ into complex components (i.e., $H_1y=(\mathrm{Re}\{H_1\}y_r-\mathrm{Im}\{H_1\}y_i)+i(\mathrm{Im}\{H_1\}y_r+\mathrm{Re}\{H_1\}y_i)$). It is preferred that $H_1(e^{j\omega})$ depend on the C model to facilitate convergence of the system to a stable solution. The output weighting element 14 therefore scales, phase-shifts and combines output signals y to cause the system to converge and to selectively constrain the correction signals $y_n$.

The remaining part of the system 10 shown in FIG. 4 can be similar to the system 10 described in FIG. 2 except for certain distinctions. For instance, the in-phase update signal $u_r$ from summer 68 is used to adapt the scaling elements 84 and 90 (i.e., adapt vector $Y_R$). The quadrature update signal $u_i$ from summer 66 is used to adapt the scaling elements 86 and 92 (i.e., adapt vector $Y_I$).

In FIG. 4, the output from the controller 12 to the n actuators (i.e. the n correction signals $y_n$) can be constrained using the techniques of singular value decomposition as described above. Preferably, this can be done by setting the output weighting element 14 (i.e. output weighting matrix $H_1(e^{j\omega})$) to the n×n matrix V, and the error weighting element 26 (i.e. error weighting matrix $H_2(e^{j\omega})$) to $-N^HU^H$ where $U^H$ is the Hermitian transpose of the p×p U matrix, and $N^H$ is the Hermitian transpose of the p×n normalizing matrix N which is formed by taking the transpose of S and inverting some of the values along the diagonal S (e.g., the values that are not zero or close to zero). In such a system, the secondary input does not contain components corresponding to the effective null space of C. That is, the secondary input does not contain components corresponding to the columns in V corresponding to singular values in C. Processing selected output signals $y_i$ and $y_r$ corresponding to values in S that are not too close to zero through V to generate the correction signals $y_n$ thus eliminates undesirable components in $y_n$ that may cause problems associated with over parameterization. Also, processing the error signals $e_p$ through $-N^HU^H$ restricts adaptation corresponding the null elements of N (i.e. the effective null space of C).

If none of the diagonal elements in N are set to zero, then in the case where there are more error sensors 22 than actuators 16, i.e. p>n, the system converges to the same minimum cost function where the solution is given by:

$$y_n(\infty)=-(C^HC)^{-1}C^Hd \quad (3)$$

where $C^H$ is the Hermitian transpose of the p×n C matrix, and d is the disturbance designated by reference numeral 18. In addition, the system 10 converges in less time than a system implementing the gradient descent method. In the case where there are less error sensors 22 than actuators 16, i.e. p<n, the controller output $y_n$ represents the minimum required energy in the n secondary inputs for complete cancellation of the disturbance 18.

The output 14 and the error 26 weighting elements can be chosen to rotate the coordinates of the system such that each of the n processing signal pairs (i.e., n pairs of $Z_{Rc}$ and $Z_{Rc}$) affects adaptation along one of the principle axis of the hyper-elliptical quadratic surfaces of the cost function for the correction signals $y_n$. These principal axes are orthogonal. Adaption along these axes depends on the steepness of the axis; however, normalizing with matrix N normalizes adaptation with respect each axis such that adaptation proceeds along each axis at the same rate. Therefore, adaptation occurs along a straight line in the controller parameter space towards an optimum solution. Further, the system is decoupled in that each of the n pairs of $Z_{Rc}$ and $Z_{Rc}$ do not affect the adaptation of the other pairs of $Z_{Rc}$ and $Z_{Rc}$.

Moreover, using the output weighting element 14 to provide constrained output allows for improved control over parameter leakage and for improved control over system monitoring because it allows selective leakage or monitoring along selected axes. In addition, the controller 12 can be constrained from adapting along axes corresponding to singular values by testing for small singular values and setting the corresponding elements of matrix N to zero, or equivalently, by not adapting the corresponding processing signals $Z_{Rc}$ or $Z_{Rc}$.

When tracking, it may be useful to switch between an old output weighting element 14 (i.e. old output weighting matrix $H_1(e^{j\omega})_{old}$) to a new output weighting element 14 (i.e. new output weighting matrix $H_1(e^{j\omega})_{new}$). In the preferred case where $H_1(e^{j\omega})=V$, the transition from an old set of correction signals $y_{n,old}$ to a new set of correction signals $y_{n,new}$ may be smoothed by using $V^H_{new}\, V_{old}\, y_{n,old}$ as the first $y_{n,new}$. In this manner, the set of correction signals from the previous sample period $y_{n,old}$ is matched to the set of correct signals for the present sample period $y_{n,new}$.

Figure 5:
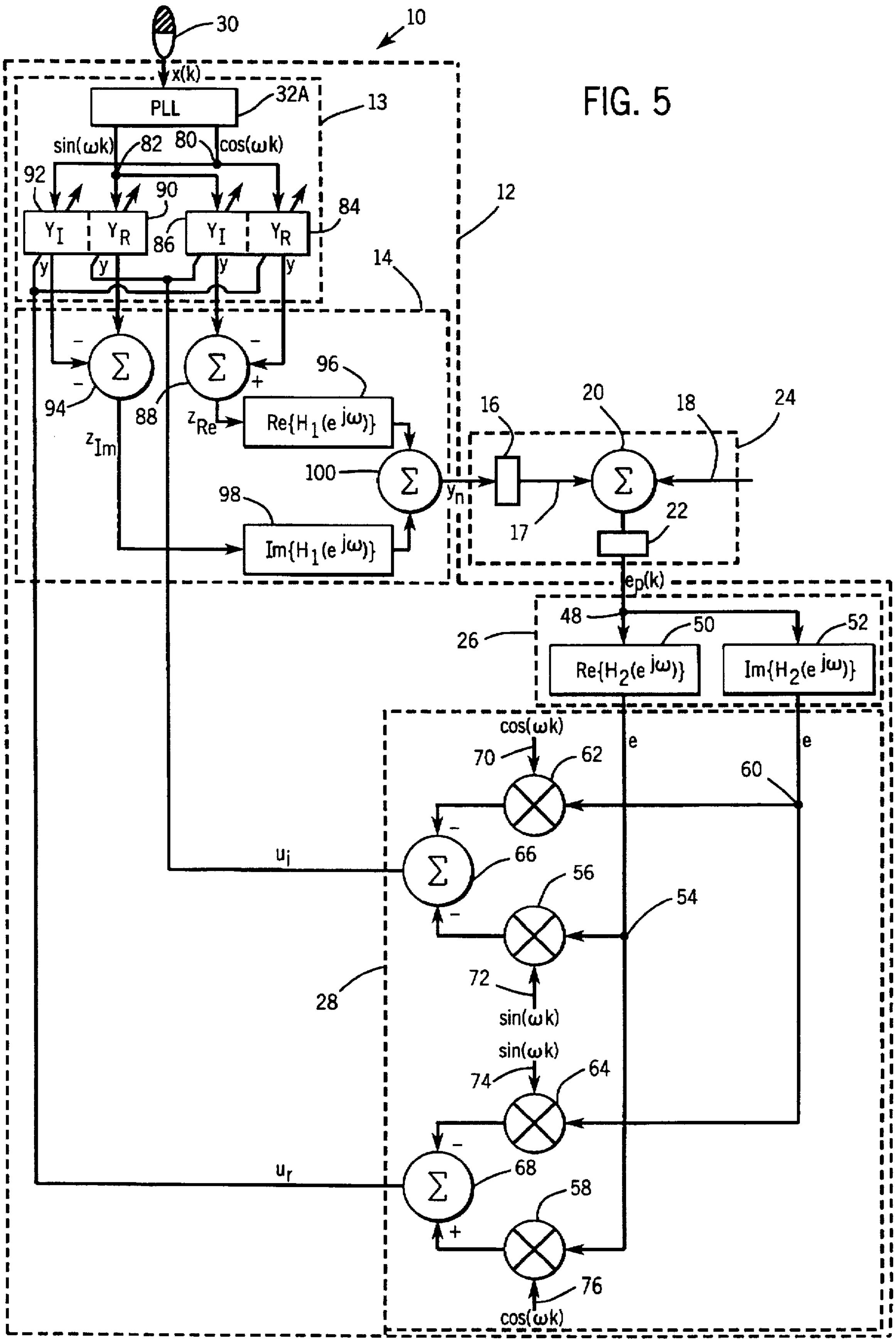
FIG. 5 is a schematic illustration of an active tonal attenuation system that has an output weighting element in accordance with the invention.

Another method to constrain the output from the controller 12 (i.e. constraining the n correction signals $y_n$), using the techniques of singular value decomposition, is to omit the error weighting element 26 (i.e. set to identity), and set the output weighting element 14 to $-VN^HU^H$ as shown in FIG. 5. In the case of n=p where none of the values of n are hulled (i.e. all of the singular values are sufficiently large), $H_1=-VN^HU^H$ is equal to $-C^{-1}$. An advantage of this method is that the output from the controller 12 can be constrained, and only a single processing matrix is required. Alternatively, the output weighting element 14 can apply an n×p matrix $H_1=-C^H$ where $C^H$ is the Hermitian transpose of the p×n C matrix.

It is recognized that various equivalents, alternatives and modifications are possible within the scope of the appended claims.

I claim:

1. An adaptive tonal control system having a system input and a system output, the adaptive tonal control system comprising:

a plurality of actuators each receiving a correction signal and outputting a secondary input, the secondary inputs combining with the system input to yield the system output;

a plurality of error sensors sensing the system output, each error sensor generating an error signal that can be used to update adaptive parameters; and an adaptive controller that outputs the correction signals, the controller having an adaptive parameter bank that outputs a plurality of output signals in accordance with adaptive parameters, a C model of a path between the output of the adaptive controller and the error sensors, the C model having an effective range and an effective null space, and an output weighting element that inputs the output signals from the parameter bank and weights the output signals to generate correction signals which are constrained to diminish components in the effective null space of the C model.

2. A system as recited in claim 1 wherein the effective null space of the C model is defined by $\|Cy_n\|$ being small, where C is a matrix representing the C model, and $y_n$ is a vector representing correction signals having non-trivial values.

3. A system as recited in claim 1 wherein:

the C model can be represented as a p×n matrix C that can be decomposed as: $C=USV^H$, where S is a p×n matrix in which the off diagonal elements are zero, U is a p×p unitary matrix, and $V^H$ is the Hermitian transpose of an n×n unitary matrix V; and the output weighting element can include a matrix representing $-VS^HU^H$, where $S^H$ is the Hermitian transpose of S and $U^H$ is the Hermitian transpose of U.

4. A system as recited in claim 3 wherein one or more of the diagonal elements in $S^H$ are normalized.

5. A system as recited in claim 1 further comprising an error weighting element that inputs the error signals from the error sensors and weights the error signals to generate error input signals.

6. A system as recited in claim 5 wherein:

the C model can be represented as a p×n matrix C that can be decomposed as: $C=USV^H$, where S is a p×n matrix in which the off diagonal elements are zero, U is a p×p unitary matrix, and $V^H$ is the Hermitian transpose of an n×n unitary matrix V;

the output weighting element includes a matrix representing V; and the error weighting element includes a matrix representing $-S^HU^H$, where $S^H$ is the Hermitian transpose of S and $U^H$ is the Hermitian transpose of U.

7. A system as recited in claim 6 wherein one or more of the diagonal elements in $S^H$ are normalized.

8. A system as recited in claim 1 wherein the adaptive parameter bank outputs a plurality of in-phase output signals, and a plurality of quadrature output signals.

9. A system as recited in claim 1 further comprising an input sensor that senses the system input and generates a reference signal in response thereto.

10. A system as recited in claim 9 further comprising a phase locked loop circuit that receives the reference signal from the input sensor and outputs an in-phase reference signal that is used in the adaptive parameter bank.

11. A system as recited in claim 10 further comprising a phase shifter that receives a copy of the in-phase reference signal and outputs a quadrature reference signal that is 90° out-of-phase from the in-phase reference signal and is also used in the adaptive parameter bank.

12. A system as recited in claim 11 wherein the output weighting element has an in-phase output weighting element, and a quadrature output weighting element, and an output summer that sums a signal from the in-phase output weighting element and from the quadrature output weighting element and outputs the correction signals.

13. An adaptive tonal control system having a system input and a system output, the adaptive control system comprising:

a plurality of actuators each receiving a correction signal and outputting a secondary input, the secondary inputs combining with the system input to yield the system output;

a plurality of error sensors sensing the system output, each sensor generating an error signal;

an adaptive controller that outputs the correction signals, the controller having an adaptive parameter bank that outputs a plurality of output signals in accordance with the adaptive parameters, the output signals being used to generate the correction signals, a C model of a path between the output of the adaptive controller and the error sensors, the C model having an effective range and an effective null space, an error weighting element that inputs the error signals from the error sensors and weights the error signals to generate error input signals that are used to update the adaptive parameters in the adaptive parameter bank such that adaptation is constrained to be within the efficiently controlling subspace of the C model.

14. A system as recited in claim 13 wherein the efficiently controlling subspace of the C model does not include the effective null space of the C model, and the effective null space of the C model is defined by $\|Cy_n\|$ being small, where C is a matrix representing the C model, and $y_n$ is a vector representing correction signal having non-trivial values.

15. A system as recited in claim 13 wherein the C model can be represented as a p×n matrix C that can be decomposed as: $C=USV^H$, where S is a p×n matrix in which the off diagonal elements are zero, U is a p×p unitary matrix, and $V^H$ is the Hermitian transpose of an n×n unitary matrix V; and the error weighting element can include a matrix representing $-VS^HU^H$, where $S^H$ is the Hermitian transpose of S and $U^H$ is the Hermitian transpose of U.

16. A system as recited in claim 15 wherein one or more of the diagonal elements in $S^H$ are normalized.

17. A system as recited in claim 13 wherein each correction signal is the summation of an in-phase output signal and a quadrature output signal.

18. A system as recited in claim 13 further comprising an input sensor that senses the system input and generates a reference signal.

19. A system as recited in claim 18 further comprising a phase locked loop circuit that receives the signal from the input sensor and outputs an in-phase reference signal.

20. A system as recited in claim 19 further comprising a phase shifter that can receive a copy of the in-phase reference signal and output a quadrature reference signal.

21. A system as recited in claim 13 wherein the error weighting element has an in-phase element that receives the error signals and outputs an in-phase error input signals, and a quadrature element that receives the error signals and outputs quadrature error input signals.

22. A system as recited in claim 21 further comprising a parameter update generator that applies an in-phase demodulation signal and a quadrature demodulation signal to the in-phase and quadrature error input signals every sample period, and outputs in-phase update signals and quadrature update signals which are used to adapt the adaptive parameters in the adaptive parameter bank.

23. An adaptive tonal control system having a system input and a system output, the adaptive control system comprising:

a plurality of actuators, each receiving a correction signal and outputting a secondary input, the secondary inputs combining with the system input to yield the system output;

a plurality of error sensors sensing the system output, each sensor generating an error signal; and an adaptive controller that outputs the correction signals and has an adaptive parameter bank that inputs a reference signal during sequential sample periods, and outputs a plurality of output signals in accordance with adaptive parameters for each of the sequential sample periods, the output signals being used to generate the correction signals, an error weighting element that receives the error signals and outputs a plurality of error input signals, a parameter update generator that applies an in-phase demodulation signal and a quadrature demodulation signal to the error input signals for each sample period when generating update signals, and outputs an in-phase update signal and a quadrature update signal that are used to update the adaptive parameters in the adaptive parameter bank.

24. A system as recited in claim 23 wherein:

the error weighting element has an in-phase weighting element that receives the error signals and outputs in-phase error input signals and a quadrature element that receives the error signals and outputs quadrature error input signals; and the parameter update generator has a first multiplier that receives quadrature error input signals and the in-phase demodulation signal and outputs a first signal to a quadrature summer, a second multiplier that receives the in-phase error input signals and the quadrature demodulation signal and outputs a second signal to the quadrature summer, the quadrature summer outputting the quadrature update signal, a third multiplier that receives the quadrature error input signals and the quadrature demodulation signal and outputs a third signal to an in-phase summer, and a fourth multiplier that receives the in-phase error input signals and the in-phase demodulation signal and outputs a fourth signal to the in-phase summer, the in-phase summer outputting the in-phase update signal.

25. In an adaptive control system having a system input and a system output, the method of controlling a tone comprising the steps of:

modeling a path between an output of an adaptive filter controller and one or more error sensors in the system to generate a C path model;

generating a plurality of output signals;

weighting the plurality of output signals to yield a plurality of correction signals in which components in the effective null space of the C path model are diminished; and using the correction signals to provide a secondary input that combines with the system input to yield the system output;

wherein the components in the effective null space are diminished by nulling components of the correction signals in which $\|Cy_n\|$ is small, where C is a matrix representing the C path model and $y_n$ is a vector representing non-trivial correction signals.

26. A method as recited in claim 25 further comprising the steps of:

sensing the system output with the error sensors to generate a plurality of error signals;

using the error signals to update the adaptive parameters that are used to generate the output signals.

27. A method as recited in claim 26 further comprising the step of:

weighting the plurality of error signals to yield a plurality of error input signals; and using the error input signals to update the adaptive parameters.

28. A method as recited in claim 26 further comprising the steps of:

tracking the frequency of the tone being controlled;

matching the plurality of correction signals of a previous sample periods to the plurality of correction signals for a present sample period to determine the weighting of the correction signals of the present sample period.

29. In an adaptive control system having a system input and a system output, a method of controlling a tone comprising the steps of:

modeling a path between an output of an adaptive controller and one or more error sensors in the system to generate a C path model;

generating a plurality of output signals in accordance with adaptive parameters;

using the output signals to provide a secondary input to the system which combines with the system input to yield the system output;

sensing the system output with error sensors to generate a plurality of error signals;

weighting the plurality of error signals to yield a plurality of error input signals such that adaptation is constrained with respect to the effective null space of the C model; and using the error input signals to update the adaptive parameters;

wherein adaptation is constrained with respect to the effective null space by nulling components of the correction signals in which $\|Cy_n\|$ is small, where C is a matrix representing the C path model and $y_n$ is a vector representing non-trivial correction signals.

30. A method as recited in claim 29 wherein:

the plurality of error signals are weighted to yield the plurality of in-phase error input signals and a plurality of quadrature error input signals; and the adaptive parameters are updated using an in-phase update signal and a quadrature update signal that are generated by modulating the in-phase error input signal and the quadrature error input signal during the sample periods when adaptation is occurring.

31. A method as recited in claim 31 further comprising the step of:

weighting the plurality of output signals to yield a plurality of correction signals in which components in the effective null space of the C path model are diminished, and using the correction signals to provide the secondary input that combines with the system input to yield the system output.

32. A method as recited in claim 31 further comprising the step of leaking components of the output signals in the effective null space of the C model.

33. In an adaptive control system having a system input and a system output, a method of controlling a tone comprising to steps of:

inputting a reference signal for sequential sample periods to an adaptive controller;

outputting a plurality of correction signals from the adaptive controller which are used to generate secondary inputs that combine with the system input to yield the system output;

sensing the system output with error sensors to generate a plurality of error signals;

modeling a path between the output of the adaptive controller and the error sensors to generate a C path model;

weighting the error signals to generate a plurality of error input signals;

applying an in-phase demodulation signal and a quadrature demodulation signal to the error input signals every sample period to generate an in-phase update signal and a quadrature update signal for sample periods when the system is generating update signals;

using the in-phase and the quadrature update signals to update the adaptive parameters.

34. The method as recited in claim 33 further comprising sensing the system input with input sensors to generate one or more reference signals every sample period.

35. A method as recited in claim 34 further comprising the step of processing each reference signal to generate an in-phase reference signal and a quadrature reference signal.

36. An adaptive tonal control system having a system input and a system output, the adaptive tonal control system comprising:

a plurality of actuators each receiving a correction signal and outputting a secondary input, the secondary inputs combining with the system input to yield the system output;

a plurality of error sensors sensing the system output, each error sensor generating an error signal that can be used to update adaptive parameters; and an adaptive controller that outputs the correction signals, the controller having an adaptive parameter bank that outputs a plurality of output signals in accordance with adaptive parameters, a C model of a path between the output of the adaptive controller and the error sensors, and an output weighting element that inputs the output signals from the parameter bank and weights the output signals to generate correction signals, wherein the output weighting element depends on the C model.

37. A system as recited in claim 36 further comprising an error weighting element that inputs the error signals from the error sensors and weights the error signals to generate error input signals.

38. A system as recited in claim 36 wherein the adaptive parameter bank outputs a plurality of in-phase output signals, and a plurality of quadrature output signals.

39. A system as recited in claim 36 further comprising an input sensor that senses the system input and generates a reference signal in response thereto.

40. A system as recited in claim 39 further comprising a phase locked loop circuit that receives the reference signal from the input sensor and outputs an in-phase reference signal that is used in the adaptive parameter bank.

41. A system as recited in claim 40 further comprising a phase shifter that receives a copy of the in-phase reference signal and outputs a quadrature reference signal that is 90° out-of-phase from the in-phase reference signal and is also used in the adaptive parameter bank.

42. A system as recited in claim 41 wherein the output weighting element has an in-phase output weighting element that receives an in-phase output signal from the adaptive parameter bank, and a quadrature output weighting element that receives a quadrature output signal from the adaptive parameter bank, and an output summer that sums a signal from the in-phase output weighting element and from the quadrature output weighting element and outputs the correction signals.

43. In an adaptive control system having a system input and a system output, the method of controlling a tone comprising the steps of:

modeling a path between an output of an adaptive filter controller and one or more error sensors in the system to generate a C path model;

generating a plurality of output signals;

processing the plurality of output signals to yield a plurality of correction signals in such a manner that the processing depends on the C model so that the system converges to a stable solution; and using the correction signals to provide a secondary input that combines with the system input to yield the system output;

wherein the output signals are generated by:

processing an in-phase reference signal with an in-phase scaling vector $Y_R$ to generate a first plurality of signals;

processing the in-phase reference signal with a quadrature scaling vector $Y_I$ to generate a second plurality of output signals;

processing a quadrature reference signal with the in-phase scaling vector $Y_R$ to generate a third plurality of output signals; and processing the quadrature reference signal with the quadrature scaling vector $Y_I$ to generate a fourth plurality of output signals.

44. A method as recited in claim 43 wherein the four output signals are processed to generate the plurality of correction signals by:

summing the first and the fourth plurality of output signals to form a plurality of in-phase processing signals $z_{Rc}$;

summing the second and the third plurality of output signals to form a plurality of quadrature processing signals $z_{Im}$;

processing the in-phase processing signals $z_{Rc}$ through an in-phase output weighting element that depends on the C model;

processing the quadrature processing signals $z_{Im}$ through a quadrature output weighting element that depends on the C model; and summing the plurality of processed in-phase processing signals and the plurality of processed quadrature processing signals to form the plurality of correction signals.

45. An adaptive tonal control system having a system input and a system output, the adaptive tonal control system comprising:

a plurality of actuators each receiving a correction signal and outputting a secondary input, the secondary inputs combining with the system input to yield the system output;

a plurality of error sensors sensing the system output, each error sensor generating an error signal that can be used to update adaptive parameters; and an adaptive controller that outputs the correction signals, the controller having an adaptive parameter bank that outputs a plurality of output signals in accordance with adaptive parameters, a C model of a path between the output of the adaptive controller and the error sensors, the C model having an effective range and an effective null space, and an output weighting element that inputs the output signals from the parameter bank and weights the output signals to generate correction signals which are constrained such that the correction signals are orthogonal to components in the effective null space of the C model.

* * * * *

UNITED STATES PATENT AND TRADEMARK OFFICE

CERTIFICATE OF CORRECTION

PATENT NO. : 5,633,795

DATED : May 27, 1997

INVENTOR(S) : Steven R. Popovich

It is certified that error appears in the above-indentified patent and that said Letters Patent is hereby corrected as shown below:

CLAIM 31, Col. 14, Line 21, delete "claim 31" and substitute therefor ---claim 29---; CLAIM 32, Col. 14, Line 28, delete "claim 31" and substitute therefor ---claim 29 ---; CLAIM 44, Col. 16, Line 18, delete "$z_{Rc}$" and substitute therefor ---$z_{Re}$---; CLAIM 44, Col. 16, Line 22, delete "$z_{Rc}$" and substitute therefor---$z_{Re}$---.

Signed and Sealed this

Twenty-ninth Day of July, 1997

Attest:

BRUCE LEHMAN

Attesting Officer

*Commissioner of Patents and Trademarks*